(12) United States Patent
Ouyang et al.

(10) Patent No.: US 10,950,674 B2
(45) Date of Patent: Mar. 16, 2021

(54) DISPLAY PANEL

(71) Applicant: Wuhan China Star Optoelectronics Semiconductor Display Technology Co., Ltd., Wuhan (CN)

(72) Inventors: Qi Ouyang, Wuhan (CN); Mugyeom Kim, Wuhan (CN); Yong Zhao, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 0 days.

(21) Appl. No.: 16/476,076

(22) PCT Filed: Mar. 25, 2019

(86) PCT No.: PCT/CN2019/079568
§ 371 (c)(1),
(2) Date: Jul. 4, 2019

(87) PCT Pub. No.: WO2020/133755
PCT Pub. Date: Jul. 2, 2020

(65) Prior Publication Data
US 2020/0203445 A1 Jun. 25, 2020

(30) Foreign Application Priority Data
Dec. 25, 2018 (CN) .......................... 201811589462.6

(51) Int. Cl.
*H01L 27/32* (2006.01)
*H01L 51/52* (2006.01)

(52) U.S. Cl.
CPC ...... *H01L 27/3246* (2013.01); *H01L 27/3216* (2013.01); *H01L 27/3218* (2013.01); *H01L 27/3234* (2013.01); *H01L 27/3262* (2013.01); *H01L 51/5275* (2013.01)

(58) Field of Classification Search
CPC combination set(s) only.
See application file for complete search history.

(56) References Cited

U.S. PATENT DOCUMENTS

| 2014/0117208 | A1* | 5/2014 | Tay ................... H01L 27/14629 250/208.1 |
| 2016/0149165 | A1* | 5/2016 | Kim ..................... H01L 27/326 257/40 |
| 2017/0053971 | A1* | 2/2017 | Sato .................... H01L 51/5275 |
| 2019/0310724 | A1* | 10/2019 | Yeke Yazdandoost ...................... H01L 51/5275 |
| 2020/0066809 | A1* | 2/2020 | Liu ..................... H01L 27/3234 |
| 2020/0105843 | A1* | 4/2020 | Baek ................... H01L 27/3234 |

* cited by examiner

*Primary Examiner* — Michelle Mandala
*Assistant Examiner* — Jordan M Klein

(57) ABSTRACT

Provided is a display panel, including a first display area and a second display area. A transparent collimator is provided in a gap between two adjacent sub-pixels in the first display area, and meanwhile, a substrate under the collimator is a thinner substrate or a transparent substrate. Thus, a certain display area of the display panel possesses good light transmittance and resolution.

10 Claims, 2 Drawing Sheets

DISPLAY PANEL

RELATED APPLICATIONS

This application is a National Phase of PCT Patent Application No. PCT/CN2019/079568 having International filing date of Mar. 25, 2019, which claims the benefit of priority of Chinese Patent Application No. 201811589462.6 filed on Dec. 25, 2018. The contents of the above applications are all incorporated by reference as if fully set forth herein in their entirety.

FIELD AND BACKGROUND OF THE INVENTION

The present invention relates to a display field, and more particularly to a display panel.

Organic Light Emitting Diode (OLED) display technology is different from the traditional liquid crystal display technology and the back light is not required. It utilizes an ultra thin organic material coating layer and a glass substrate, and theses organic material will illuminate when the current is conducted. The OLED display screen can be made lighter and thinner, and the OLED technology can develop a wider viewing angle and can save power, significantly.

Under the current trend of full-screen, although various mobile phone manufacturers have proposed a variety of solutions, the front opening remains a problem that cannot be solved. Thus, fringe hair screens, water drop screens, lifting cameras and other design solutions have emerged, constantly. In order to achieve a truly full screen, all the current companies are aggressively developing camera under screen technology.

In the related patent (CN107734102) applied for a product, Meizu, the camera is made under the screen. By taking advantage of the special transparency of the graphene screen, the camera is placed under the screen; in a camera under screen patent (WO2017126863) announced by Samsung, the front camera is directly designed on the printed circuit board, and can capture the picture through a lens hole on the display screen but the front screen coverage will remain unchanged. Except the front camera, some sensors and components which are standard with smart phones including microphones, fingerprint scanners, cameras and transparent antennas will all be located below the front panel glass.

Although the substrate of the flexible OLED screen itself is transparently plastic, if the camera is placed under the OLED screen and good image can be obtained, the transmittance of the screen needs to be at least 80% but the current technology can only be about 40%. Even the image can be obtained, a "window effect" can occur unless the pixel area density of the screen above the camera is drastically reduced.

SUMMARY OF THE INVENTION

An objective of the present invention is to provide a display panel to solve the technical problem of the prior art that a front camera placed under a screen has low transmittance and low resolution.

For solving the aforesaid issues, the present invention provides a display panel, including a first display area and a second display area; wherein the display panel further includes a first sub-pixel, a second sub-pixel and a collimator, and the first sub-pixel is located in the first display area; wherein a first pixel gap is formed between adjacent first sub-pixels; the second sub-pixel is located in the second display area; wherein a second pixel gap is formed between adjacent second sub-pixels; and two or more collimators are located in the first display area, wherein each of the collimators is disposed in one first pixel gap.

Furthermore, a pixel area density of the first sub-pixels in the first display area is same as a pixel area density of the second sub-pixels in the second display area.

Furthermore, the first pixel gap in the first display area is larger than the second pixel gap in the second display area.

Furthermore, as the first sub-pixel and the second sub-pixel have a same color, an area of the first sub-pixel is less than or equal to an area of the second sub-pixel.

Furthermore, the two or more collimators are arranged in at least one straight line; or the two or more collimators are arranged in a matrix; or the two or more collimators are evenly distributed in the first display area.

Furthermore, a plan view shape of the collimators is a diamond, a circle, a rectangle, a regular polygon or a curved polygon.

Furthermore, in the first display area and the second display area, the display panel further includes a substrate, a thin film transistor layer, a pixel definition layer, a light emitting layer and a via hole; the thin film transistor layer is disposed on one surface of the substrate, wherein the thin film transistor layer includes a plurality of thin film transistors, and each of the thin film transistors corresponds to one first sub-pixel or one second sub-pixel; the pixel definition layer is disposed on the thin film transistor layer, and the light emitting layer is disposed in the pixel definition layer; the via hole is disposed between two thin film transistors of the first display area and extended from the light emitting layer to an interior of the thin film transistor layer; wherein each of the collimators is correspondingly disposed in one via hole.

Furthermore, in the first display area and the second display area, the display panel further includes dielectric layer and a planarization layer, and the dielectric layer is disposed on the plurality of thin film transistors; the planarization layer is disposed on the dielectric layer; wherein the display panel further includes a first inorganic layer and an organic layer, and the first inorganic layer is formed on the light emitting layer, on an inner sidewall of the via hole and on a bottom surface of the via hole, and the organic layer is formed on the first inorganic layer, wherein in the first display area, the organic layer completely fills the via hole to form a corresponding collimator; wherein a refractive index of the organic layer is greater than a refractive index of the pixel definition layer; a refractive index of the organic layer is greater than a refractive index of the planarization layer.

Furthermore, the display panel further includes a photosensitive sensor, disposed on one side of the substrate away from the collimator, wherein the photosensitive sensor possesses a photosensitive side, and the photosensitive side correspondingly faces the collimator; wherein one side of the substrate possesses a groove toward the photosensitive sensor, and each groove corresponds to one photosensitive sensor.

Furthermore, the display panel further includes a second inorganic layer, a touch layer, a polarizer and a cover, and the second inorganic layer is formed on the organic layer; the touch layer is disposed on the second inorganic layer; the polarizer is disposed on the touch layer; and the cover is disposed on the polarizer.

The benefit of the present invention is to provide a display panel, including a first display area and a second display area. A transparent collimator is provided in a gap between two adjacent sub-pixels in the first display area, and meanwhile, a substrate under the collimator is a thinner substrate or a transparent substrate. Thus, when the first display area is used for photographing, the light transmittance can be improved; when the first display area is used for display, the same screen resolution can be maintained with the second display area.

BRIEF DESCRIPTION OF THE SEVERAL VIEWS OF THE DRAWINGS

In order to more clearly illustrate the embodiments of the present invention, the following figures will be described in the embodiments are briefly introduced. It is obvious that the drawings are merely some embodiments of the present invention, those of ordinary skill in this field can obtain other figures according to these figures without paying the premise.

Figure 1:
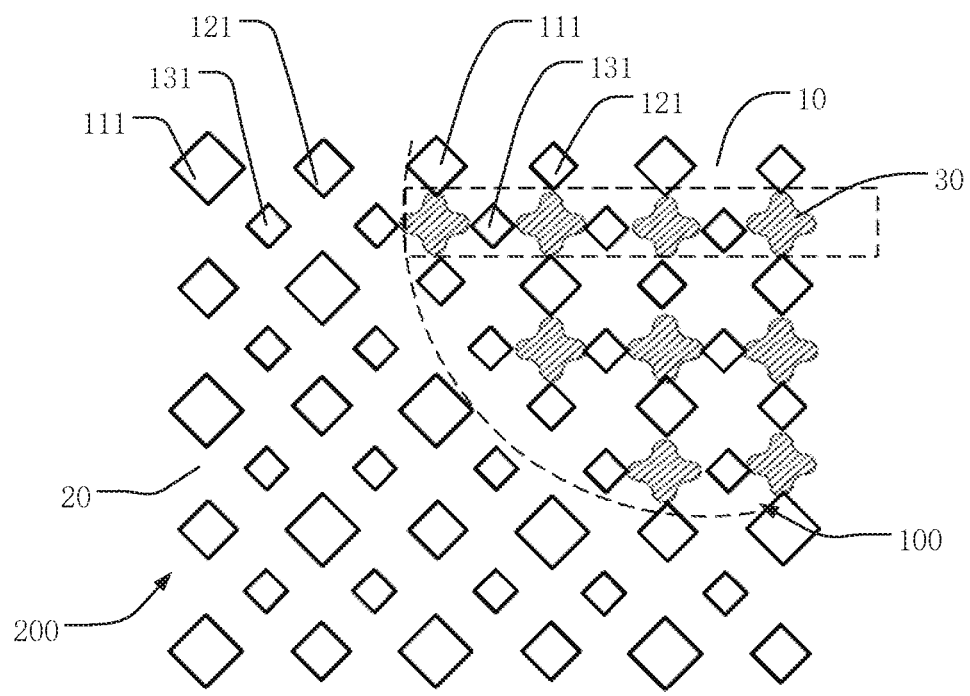
FIG. 1 is a diagram of a first pixel structure according to an embodiment of the present invention.

The parts in the drawing are identified as follows: 100 first display area; 200 second display area; 10 first sub-pixel; 20 second sub-pixel; 30 collimator; 1 substrate; 2 thin film transistor layer; 3 pixel definition layer; 4 light emitting layer; 51 first inorganic layer; 6 organic layer; 52 second inorganic layer; 7 touch layer; 8 polarizer; 9 cover; 21 buffer layer; 22 active layer; 231 first gate insulating layer; 241 first gate electrode; 232 second gate insulating layer; 242 second gate electrode; 25 dielectric layer; 26 source/drain electrode; 27 planarization layer; 28 anode; 201 thin film transistor; 101 via hole; 102 groove; 103 photosensitive sensor; 1031 photosensitive side; 111 blue sub-pixel; 121 red sub-pixel; 131 green sub-pixel.

DESCRIPTION OF SPECIFIC EMBODIMENTS OF THE INVENTION

The preferred embodiments of the present invention are described below with reference to the accompanying drawings to illustrate that the invention can be implemented. These embodiments can fully introduce the technical content of the present invention to those skilled in the art, so that the technical content of the present invention is more clear and easy to understand. However, the invention may be achieved in many different forms of embodiments, and the scope of the invention is not limited to the embodiments set forth herein.

The terms used in the description of the present invention are intended to describe a particular embodiment, and are not intended to illustrate the concept of the invention. An expressions used in the singular encompasses the plural form of expression unless the context clearly dictates otherwise. In the present specification, it should be understood that terms such as "including", "having" and "comprising" and like terms are intended to specify the possibility of the presence of disclosed features, numbers, steps, actions, components, parts, or combinations thereof in the description of the present invention, and are not intended to preclude the possibility of the presence or addition of one or more other features, numbers, steps, actions, components, parts or combinations thereof. The same reference numerals in the drawings denote the same parts.

Figure 2:
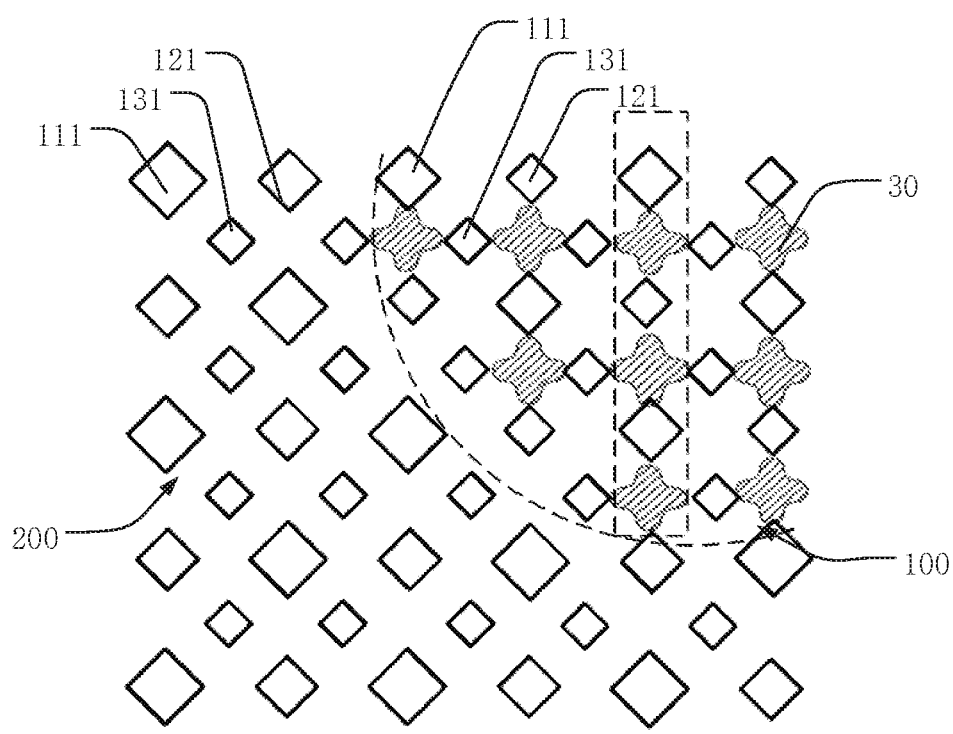
FIG. 2 is a diagram of a second pixel structure according to an embodiment of the present invention.
Figure 3:
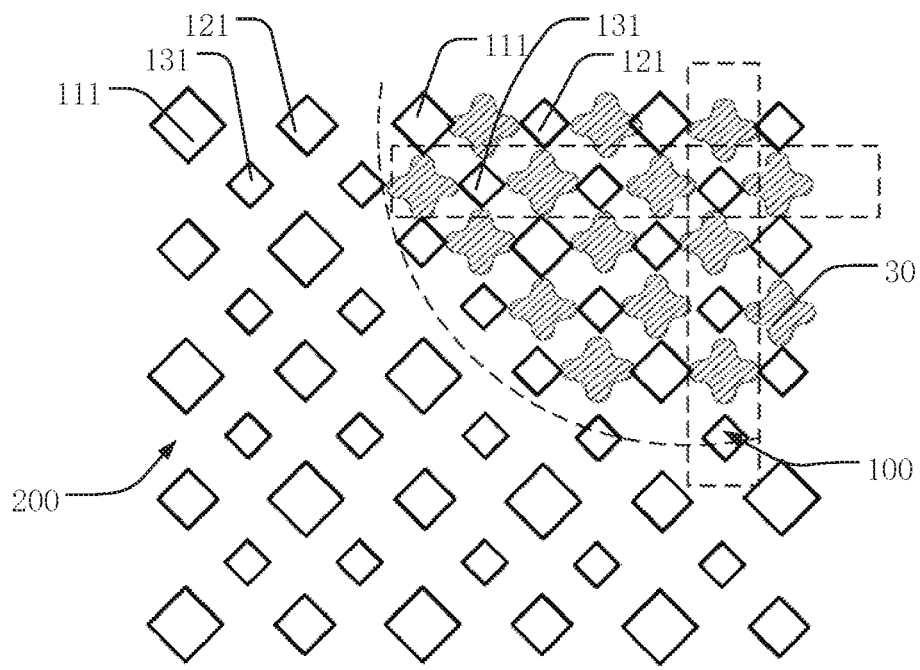
FIG. 3 is a diagram of a third pixel structure according to an embodiment of the present invention.

As shown in FIG. 1 to FIG. 3, the embodiment provides a display panel including a first display area 100 and a second display area 200. The first display area 100 can be used for both photographing and display.

A first sub-pixel 10 is located in the first display area 100; a first pixel gap is formed between adjacent first sub-pixels 10; A second sub-pixel 20 is located in the second display area 200; a second pixel gap is formed between adjacent second sub-pixels 20; and two or more collimators 30 are located in the first display area 100, wherein each of the collimators 30 is disposed in one first pixel gap. Mainly, when the first display area 100 is used for photographing, the light transmittance of the image capturing area can be improved.

The first sub-pixel 10 and the second sub-pixel 20 may include only one type of sub-pixels, and may also include a plurality of sub-pixels, which are not limited herein. Preferably, the first sub-pixel 10 and the second sub-pixel 20 of the present embodiment respectively include a blue sub-pixel 111, a red sub-pixel 121 and a green sub-pixel 131, but are not limited to these three colors.

Each of the three different color sub-pixels constitutes one pixel unit, and the pixel area density of each pixel unit is the same, and the pixel area density refers to a number of pixel units existing in a unit area. A pixel area density of the first sub-pixels 10 in the first display area 100 is the same as a pixel area density of the second sub-pixels 20 in the second display area 200. Thus, when the first display area 100 is used for display, the first display area 100 and the second display area 200 show images together, and the first display area 100 and the second display area 200 maintain the same screen resolution.

As the first sub-pixel 10 and the second sub-pixel 20 have the same color, an area of the first sub-pixel 10 is less than or equal to an area of the second sub-pixel 20. For instance, as the area of the blue sub-pixel 111 of the first display area 100 is smaller than the area of the blue sub-pixel 111 of the second display area 200, the first pixel gap in the first display area 100 is larger than the second pixel gap in the second display area 200. gap, and the pixel gap refers to a distance between two adjacent sub-pixels; since the collimator 30 is disposed in the first pixel gap, as the first display area 100 is used for photographing, the first display area 100 possesses good light transmittance. Preferably, as the area of the blue sub-pixel 111 and the red sub-pixel 121 of the first display area 100 is smaller than the area of the blue sub-pixel 111 and the red sub-pixel 121 of the second display area 200, the collimator 30 is disposed in the first pixel gap. The two or more collimators 30 are arranged in at least one straight line; or the two or more collimators 30 are arranged in a matrix; or the two or more collimators 30 are evenly distributed in the first display area 100.

As shown in FIG. 1, as the area of the blue sub-pixel 111 and the red sub-pixel 121 of the first display area 100 is smaller than the area of the blue sub-pixel 111 and the red sub-pixel 121 of the second display area 200, a plurality of collimators 30 are disposed between the blue sub-pixel 111 and the red sub-pixel 121, and the two or more collimators 30 are arranged in at least one straight line. As the first display area 100 is used for display, the first display area 100 and the second display area 200 show images together, and the first display area 100 and the second display area 200 maintain the same screen resolution; as the first display area 100 is used for photographing, the first display area 100 possesses good light transmittance.

As shown in FIG. 2, as the area of the blue sub-pixel 111 and the red sub-pixel 121 of the first display area 100 is smaller than the area of the blue sub-pixel 111 and the red sub-pixel 121 of the second display area 200, a plurality of collimators 30 are disposed between the blue sub-pixel 111 and the red sub-pixel 121, and the two or more collimators 30 are arranged in at least one straight line. As the first display area 100 is used for display, the first display area 100 and the second display area 200 show images together, and the first display area 100 and the second display area 200 maintain the same screen resolution; as the first display area 100 is used for photographing, the first display area 100 possesses good light transmittance.

As shown in FIG. 3, as the area of the blue sub-pixel 111 and the red sub-pixel 121 of the first display area 100 is smaller than the area of the blue sub-pixel 111 and the red sub-pixel 121 of the second display area 200, a plurality of collimators 30 are disposed in gaps of the four sub-pixels, and the collimators 30 are arranged in a matrix, as light is incident from various directions and concentrated in the first display area, the amount of incident light can be increased. As the first display area 100 is used for display, the first display area 100 and the second display area 200 show images together, and the first display area 100 and the second display area 200 maintain the same screen resolution; as the first display area 100 is used for photographing, the first display area 100 possesses good light transmittance.

The collimator 30 is made of a transparent material, and the collimator 30 can ensure that the light emitted by the collimator is parallel, thereby avoiding the influence of the identification of the photographing object due to interference or diffraction during the photographing process; besides, a plan view shape of the collimators 30 is preferably a curved polygon, and may also be a diamond, a circle, a rectangle or a regular polygon. The curved polygon may be a structure having irregularities or a pattern formed by a curved structure, similar to a petal shape, as long as the first pixel gap can be completely filled as much as possible, thereby reducing scattering and increasing the amount of the incident light; the plan view shape in this embodiment refers to a view obtained by orthographic projection from the upper side to the lower side of the display panel.

Figure 4:
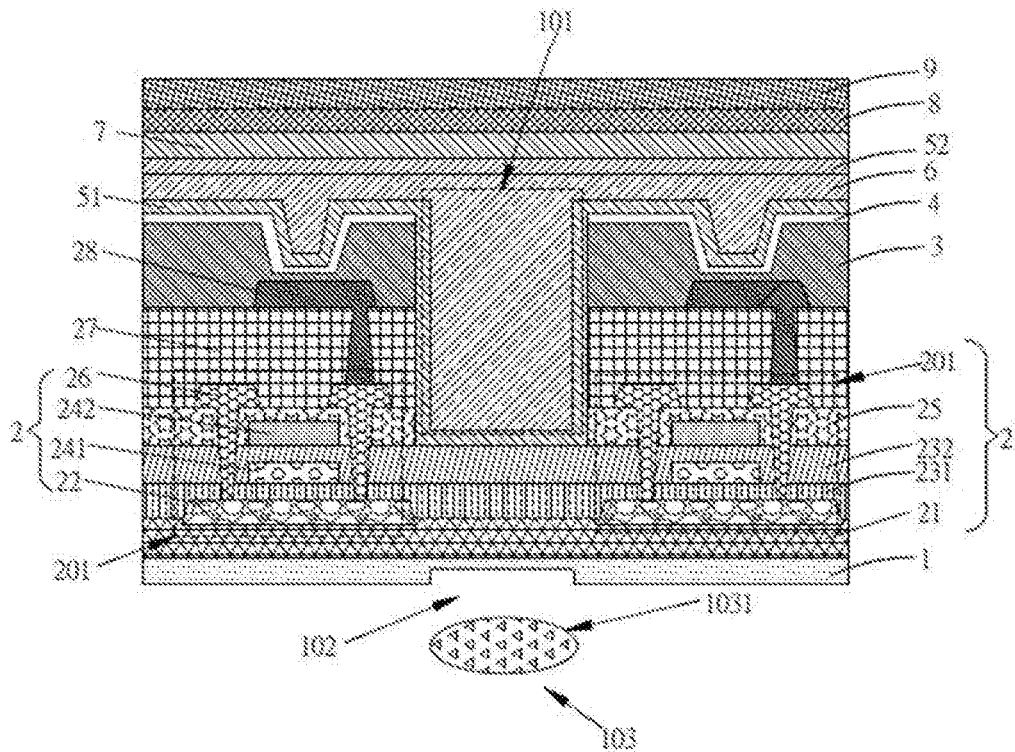
FIG. 4 is a structural diagram of a display panel according to an embodiment of the present invention.

As shown in FIG. 4, the display panel includes a substrate 1, a thin film transistor layer 2, a pixel definition layer 3, a light emitting layer 4, a first inorganic layer 51, an organic layer 6, a second inorganic layer 52, a touch layer 7, a polarizer 8, a cover 9, a via hole 101, a groove 102 and a photosensitive sensor 103.

A material of the substrate 1 is mainly polyimide (PI), and the PI material can effectively improve the transmittance.

The thin film transistor layer 2 is provided on an upper surface of the substrate 1. The thin film transistor layer 2 includes a buffer layer 21, an active layer 22, a first gate insulating layer 231, a first gate electrode 241, a second gate insulating layer 232, a second gate electrode 242, a dielectric layer 25, a source/drain electrode 26, a planarization layer 27 and an anode 28. Each of the active layer 22 and the first gate electrode 241, the second gate layer 242 and the source/drain electrode 26 corresponding to the active layer 22 form one thin film transistor 201. Specifically, the buffer layer 21 is formed on the substrate 1, and a material of the buffer layer 21 is one of silicon nitride, silicon oxide or silicon oxynitride; the active layer 22 is disposed on the buffer layer 21; the first gate insulating layer 231 is disposed between the buffer layer 21 and the first gate electrode 241, and the first gate insulating layer 231 mainly serves to insulate the first gate electrode 241; the second gate insulating layer 232 is disposed between the first gate electrode 241 and the second gate electrode 242 to isolate the first gate electrode 241 from the second gate electrode 242 to cause a short circuit; the source/drain electrode 26 is disposed on the buffer layer 21, and the source functions as a collector, and the drain functions as an emitter; the dielectric layer 25 is in contact with the second gate electrode, and the dielectric layer 25 completely covers the second gate electrode 242. The dielectric layer 25 can increase an activation current of the thin film transistor 201 and meanwhile reduce the capacitance effect between the gate and the source/drain electrode, thereby improving the display quality of the display panel; the planarization layer 27 is disposed on the source/drain electrode 26 and the dielectric layer 25, on one hand, to make a surface of the thin film transistor 201 more flat; on the other hand to reduce a capacitance between the data line connecting the structure of the thin film transistor 201 and the source/drain electrode 26, for reducing loading of the data line; the anode 28 is disposed on the planarization layer 27, wherein a cathode is disposed in the organic layer, and no specific description is made herein.

The pixel definition layer 3 is disposed on the upper surface of the thin film transistor layer 2, and the pixel definition layer 3 may be made of various photoresist materials, which is not limited herein; the light emitting layer 4 covers the upper surface of the pixel definition layer 3.

During the encapsulation process, the first inorganic layer 51 is formed on the surface of the light emitting layer 6 and the inner sidewall of the via hole 101, and the first inorganic layer 51 is extended to the surface of the dielectric layer 25; the organic layer 6 is formed on the upper surface of the first inorganic layer 51 and in the via hole 101; the organic layer in the via hole 101 forms the collimator; the second inorganic layer 52 is formed on the upper surface of the organic layer 6; the touch layer 7 is disposed on the upper surface of the second inorganic layer 52; the polarizer 8 is disposed on the upper surface of the touch layer 7, and the polarizer 8 is made of a transparent glass material, which can increase the amount of the incident light; the cover plate 9 is a transparent glass cover plate and is disposed on the upper surface of the polarizer 8. The cover plate 9 is attached to the upper surface of the polarizer 8 by optical adhesive. The optical adhesive possesses the characteristics of high light transmittance and high adhesive strength.

The via hole 101 is located in the first display area, and sequentially penetrates through the light emitting layer 4, the pixel definition layer 3, the planarization layer 26 and the second gate insulating layer 232; in the display panel, a plurality of via holes 101 may be provided, and the organic layer 6 completely fills the via holes 101 to form the collimators by inkjet printing. Therefore, as the first display area is used for display, the first display area and the second display area show images together, and the first display area and the second display area maintain the same screen resolution; as the first display area is used for photographing, the first display area possesses good light transmittance.

The photosensitive sensor 103 is disposed on one side of the substrate 1 away from the collimator. The photosensitive sensor 103 possesses a photosensitive side 1031, and the photosensitive side correspondingly faces the collimator. By the thin film encapsulation process, the organic layer 6 completely fills the via hole 101 to form the corresponding collimator.

The via hole 101 is disposed between the two thin film transistors 201. The organic material in the via hole 101 is a transparent material, and the filled polymer is an acrylic material, preferably polymethyl methacrylate, which can gather more light on the photosensitive sensor 103; the material of the pixel definition layer 3 and the planarization layer 27 at the edge of the via hole 101 is preferably polyimide, which can reduce scattering of light. The refractive index of the organic layer 6 is greater than the refractive index of the pixel definition layer 3, while the refractive index of the organic layer 6 is also greater than the refractive index of the planarization layer 27. Accordingly, more light can be gathered to the photosensitive sensor 103, which can improve the light transmittance of the photographing area and can maintain better resolution.

The display panel in this embodiment may be provided with a plurality of via holes 101 for forming a plurality of collimators. When the light is irradiated onto the display panel, the light sequentially passes through the cover 9, the polarizer 8, the second inorganic layer 52, the organic layer 6, the first inorganic layer 51, the light emitting layer 4, the pixel definition layer 3, the thin film transistor layer 2 and the substrate 1, and then the light is gathered on the photosensitive sensor 103. The light is mainly focused in the via hole 101 of the display panel, and then the light passes through the transparent substrate 1. Finally, under the action of the transparent PI substrate, the light is concentrated on the photosensitive sensor 103. Thereby, the light transmittance of the photographing area is improved, and the screen resolution can also be ensured.

In another embodiment, the substrate 1 of the photosensitive sensor 103 possesses a groove 102, and each groove 102 corresponds to one photosensitive sensor 103. The groove 102 is recessed on the lower surface of the substrate 1, and the groove 102 is disposed opposite to the via hole 101 and is located in the first display area. During the encapsulation process, the organic material forms the collimator in the via hole 101. In addition, the depth of the groove 102 is greater than half of the thickness of the substrate 1, so that the light can penetrate the substrate 1 more easily to be gathered on the photosensitive sensor 103, thereby improving the light transmittance of the first display area, and meanwhile ensuring the screen resolution.

Above are only specific embodiments of the present invention, the scope of the present invention is not limited to this, and to any persons who are skilled in the art, change or replacement which is easily derived should be covered by the protected scope of the invention. Thus, the protected scope of the invention should go by the subject claims.

What is claimed is:

1. A display panel, including a first display area and a second display area; wherein the display panel further includes:
   a first sub-pixel located in the first display area; wherein a first pixel gap is formed between adjacent first sub-pixels;
   a second sub-pixel located in the second display area; wherein a second pixel gap is formed between adjacent second sub-pixels; and
   two or more collimators located in the first display area, wherein each of the collimators is disposed in one first pixel gap;
   wherein in the first display area and the second display area, the display panel further includes:
   a substrate;
   a thin film transistor layer, disposed on one surface of the substrate, wherein the thin film transistor layer includes a plurality of thin film transistors, and each of the thin film transistors corresponds to one first sub-pixel or one second sub-pixel;
   a pixel definition layer, disposed on the thin film transistor layer;
   a light emitting layer, disposed in the pixel definition layer;
   a via hole, disposed between two thin film transistors of the first displa area and extended from the light emitting layer to an interior of the thin film transistor layer:
   a first inorganic layer, formed on the light emitting layer, on an inner sidewall of the via hole and on a bottom surface of the via hole; and
   an organic layer, formed on the first inorganic layer, wherein in the first display area, the organic layer completely fills the via hole to form a corresponding collimator.

2. The display panel according to claim 1, wherein a pixel area density of the first sub-pixels in the first display area is same as a pixel area density of the second sub-pixels in the second display area.

3. The display panel according to claim 1, wherein the first pixel gap in the first display area is larger than the second pixel gap in the second display area.

4. The display panel according to claim 1, wherein as the first sub-pixel and the second sub-pixel have a same color, and an area of the first sub-pixel is less than or equal to an area of the second sub-pixel.

5. The display panel according to claim 1, wherein the two or more collimators are arranged in at least one straight line; or the two or more collimators are arranged in a matrix; or the two or more collimators are evenly distributed in the first display area.

6. The display panel according to claim 1, wherein a plan view shape of the collimators is a diamond, a circle, a rectangle, a regular polygon or a curved polygon.

7. The display panel according to claim 1, wherein in the first display area and the second display area:
   each of the collimators is correspondingly disposed in one via hole.

8. The display panel according to claim 7, wherein the display panel further includes a photosensitive sensor, disposed on one side of the substrate away from the collimator, wherein the photosensitive sensor possesses a photosensitive side, and the photosensitive side correspondingly faces the collimator;
   wherein one side of the substrate possesses a groove toward the photosensitive sensor, and the groove corresponds to one photosensitive sensor.

9. The display panel according to claim 7, wherein the display panel further includes:
   a second inorganic layer, formed on the organic layer;
   a touch layer, disposed on the second inorganic layer;
   a polarizer, disposed on the touch layer; and
   a cover, disposed on the polarizer.

10. The display panel according to claim 1, wherein in the first display area and the second display area, the thin film transistor layer further includes:
    a dielectric layer, disposed on the plurality of thin film transistors; and
    a planarization layer, disposed on the dielectric layer;
    wherein a refractive index of the organic layer is greater than a refractive index of the pixel definition layer;
    a refractive index of the organic layer is greater than a refractive index of the planarization layer.

* * * * *